United States Patent
Stabile

(10) Patent No.: US 7,258,150 B2
(45) Date of Patent: *Aug. 21, 2007

(54) MACHINE FOR CONTINUOUSLY PRODUCING PLASTIC LAMINATES IN A COLD PRESS

(75) Inventor: Aldo Stabile, Crema (IT)

(73) Assignee: Thermo Engineering SRL, Verona (IT)

( * ) Notice: Subject to any disclaimer, the term of this patent is extended or adjusted under 35 U.S.C. 154(b) by 430 days.

This patent is subject to a terminal disclaimer.

(21) Appl. No.: 10/501,170

(22) PCT Filed: Feb. 15, 2002

(86) PCT No.: PCT/IT02/00090

§ 371 (c)(1),
(2), (4) Date: Jul. 12, 2004

(87) PCT Pub. No.: WO03/064156

PCT Pub. Date: Aug. 7, 2003

(65) Prior Publication Data

US 2005/0077001 A1 Apr. 14, 2005

(30) Foreign Application Priority Data

Jan. 29, 2002 (IT) .......................... MI2002A0153

(51) Int. Cl.
*B32B 37/06* (2006.01)
(52) U.S. Cl. ................. 156/350; 156/380.2; 156/583.1
(58) Field of Classification Search ............ 156/583.5, 156/380.6, 380.2, 350, 583.1; 100/151; 219/293, 219/388
See application file for complete search history.

(56) References Cited

U.S. PATENT DOCUMENTS

| 3,094,453 | A | * | 6/1963 | Scherer | 156/494 |
| 3,236,714 | A | * | 2/1966 | Traut | 156/249 |
| 4,202,721 | A | * | 5/1980 | Roberts | 156/358 |
| 4,921,569 | A |   | 5/1990 | Held | |
| 5,615,470 | A |   | 4/1997 | Ceraso | |
| 5,725,711 | A | * | 3/1998 | Taylor | 156/228 |

FOREIGN PATENT DOCUMENTS

DE 198 53 444 6/1999
GB 2 041 290 A 9/1980

* cited by examiner

Primary Examiner—Richard Crispino
Assistant Examiner—Emily Chimiak
(74) Attorney, Agent, or Firm—Michael J. Striker

(57) ABSTRACT

Continuous installation (10) for the production of plastic laminates including multi-layer laminates (110, 120, 130), comprising a cold press (11) having a lower fixed plate (12) on which is laid a band of aluminium for carrying and drawing inside the press strips of copper (50, 90) and bands of pre-preg (70, 71, 80, 81) partially sliding on the surface of a structure (60) upstream of the press, to allow multi-layer laminates (130) to be placed on said bands (70, 71), said aluminium band (20) remaining in continuous contact with a pair of electrodes (30, 31), placed respectively at the entry to and at the exit from the press, and connected to the electric circuit of a generator (40) of electric current so that, on closure of the press and of said electric circuit, the fraction of metal band (20) comprised between the two electrodes (30, 31) functions as an electric resistance generating the heat needed for pressing.

7 Claims, 2 Drawing Sheets

MACHINE FOR CONTINUOUSLY PRODUCING PLASTIC LAMINATES IN A COLD PRESS

CROSS-REFERENCE

Figure 1:
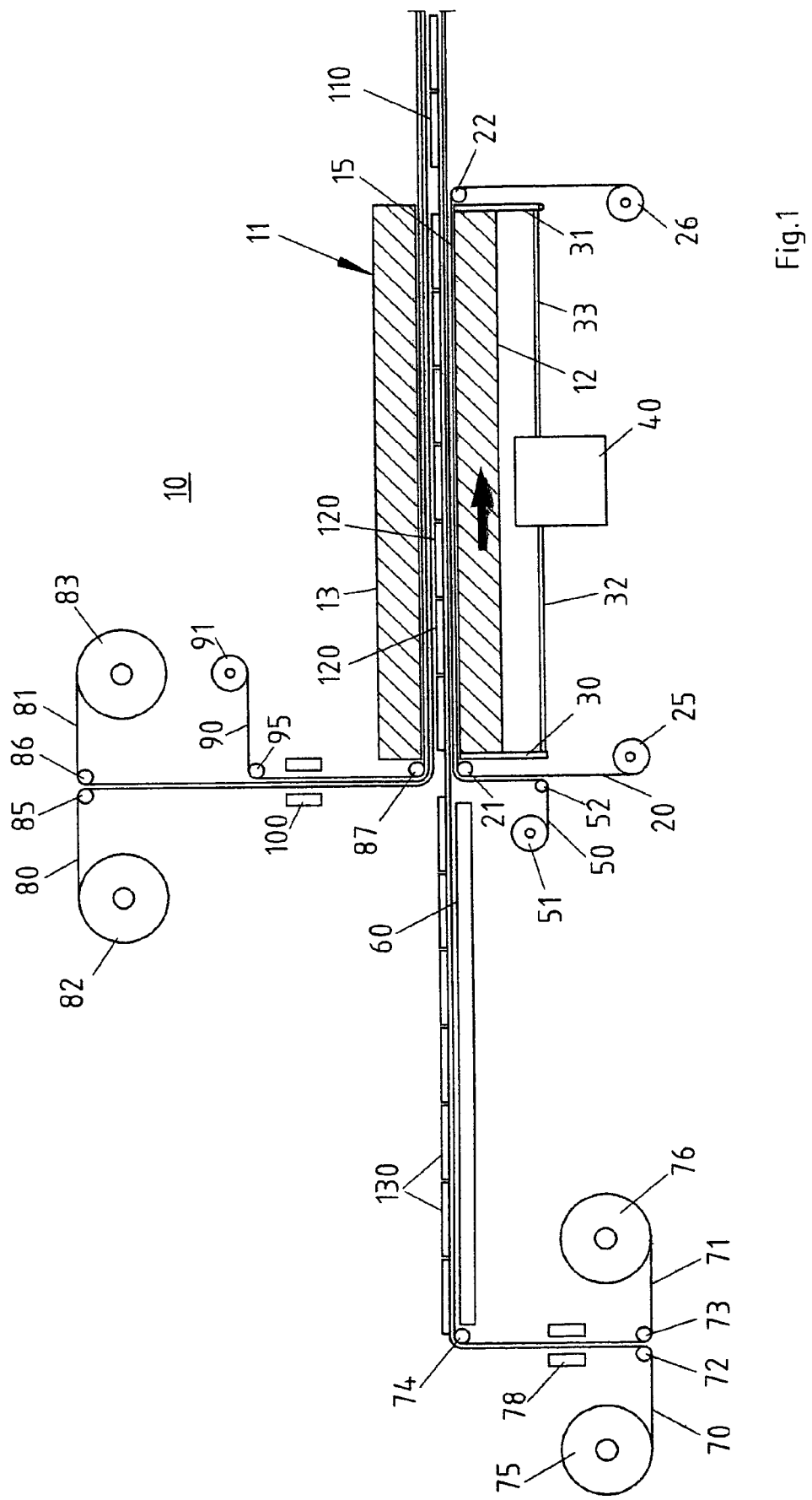

The invention described and claimed hereinbelow is also described in PCT/IT/IT02/00090, filed on Feb. 15, 2002 and MI2002A000153, filed in Italy on Jan. 29, 2002. This Italian Patent Application, whose subject matter is incorporated here by reference, provides the basis for a claim of priority of invention under 35 U.S.C. 119(a)-(d).

BACKGROUND OF THE INVENTION

The invention concerns installations for making plastic laminates with metal laminae especially for printed circuits, including the multi-layer laminates.

Plastic laminates for printed circuits are normally made by forming packages consisting of sheets of pre-preg, associated to heat and pressure, with a sheet of metal on one or on both faces of the package.

To increase production a hot press is used to obtain several plastic laminates at each working cycle, the packages being piled up with steel flattening sheets in between them. Automatic loading means are used to place the piles on the plates of a suitable press for providing pressure and heat simultaneously.

At the end of the working cycle, lasting 60'-90' at temperatures up to 180° C. and at pressure levels of from 10 to 50 kg/cm², the packages are transferred from the hot press to a cold press for the cooling cycle, at the end of which an automatic unloading means removes them and despatches them to a package separating line. Here the plastic laminates are separated from the flattening sheets which are cleaned and transferred to the packaging department.

At the end of the heating cycle lasting over 100', including cooling at 30-50° C., a compact and rigid product is obtained with all its component parts closely associated. Presses suitable for such production requirements are complex due to the number of plates, to the need for simuultaneous production of heat and pressure by conduction, with well-defined and precisely functioning cycles, at temperatures as uniform as possible in the various packages forming the pile; obviously however only those at the top and bottom will be in direct contact with the heat-generating plates.

Propagation of heat from the hot plates to the piled up packages, especially to those immediately above and below the packages in contact with said hotplates, is greatly hindered by the heat having to pass through the various layers of prepreg which, consisting as they do of paper, fiberglass and plastic materials, are very poor conductors of heat.

Cooling each package at the end of the cycle will similarly be hindered by the compactness of the piles of packages.

The presence of so many plates renders more complex the structure of the press, as well as loading and unloading of the packages.

To overcome these drawbacks, a few years ago the same inventor disclosed a process for endothermic heating of the packages using the metal laminae themselves, especially copper laminae, to generate heat by connecting them to a suitable source of electricity thereby transforming them into electric resistances.

On terminating the heating cycle lasting 40'-60', the process continues as described above.

This process offers appreciable advantages especially in generating and diffusing heat as the means required are extremely simple, but above all due to elimination of problems at present existing in the use of hot presses, and obtaining, within a short space of time, penetration of the heat to the packages closest to the centre of the pile. As endothermic heating signifies that heat is actually generated at the level of each package, they all reach a uniform temperature within a short time which also signifies a shorter production cycle and higher quality products.

The drawback in making up the packages however remains, especially because a strip of copper, or of another highly conductive material, has to be wound serpentinewise round the package formed of sheets of prepreg.

In certain special cases, this composition may become complex and irregular in view of the size of the laminates and of the need for ever greater accuracy in the production of printed circuits and multi-layer laminates.

Another problem arises over separating the packages in the pile as the copper strips passing from one package to another must be cut and trimmed.

It will be clear from the above that, in both processes, the funda-mental part, namely the press which provides pressure and heat, assumes a role of almost secondary importance in terms of both cost and time.

The present disclosure overcomes the drawbacks referred to above and offers other considerable advantages as will now be described.

SUMMARY OF THE INVENTION

Subject of the disclosure is a continuous installation for producing both ordinary and multi-layer laminates, comprising a cold press with a lower fixed plate and an upper mobile one.

On the upper surface of the lower plate a metal band is laid for supporting and drawing along, inside the press, components of the plastic laminates consisting of bands of prepreg and strips of copper.

This metal band maintains continuous contact with a pair of electrodes, one placed at the entry to the press and the other at the exit, situated on the electric circuit of a suitably powered generator of electric current.

It follows that when said plastic laminate components have been drawn inside the press, causing both the press and the electric circuit to close, the fraction of said metal band comprised between the two electrodes will function as an electric resistance generating the heat needed for production of plastic laminates.

Electrically motor-driven means unwind the metal band from a reel at the entry to the press, rewinding it onto another reel at the exit.

The metal band is preferably of aluminium.

The bands of pre-preg and strips of copper are fed in from reels and are moved forward by electrically motor-driven means.

The plastic laminate components comprise a group, here called the lower group, situatedso as to slide on the surface of a horizontal structure upstream of the press, substantially at the level of the metal band that supports and draws the components inside the press itself.

A number of multi-layer laminates can be placed, in one or more rows, on the fraction of said lower group situated on the surface of the horizontal structure.

An electronic programming and drive processor regulates working cycles by coordinating opening and closing of the press, translation inside it of the metal band for supporting and drawing components along, and the motor-driven means for feeding in plastic laminate components.

Once introduction of components into the press has been completed comprising multi-layer laminates, where present, and the press having been closed to start the working cycle, a fresh set of multi-layer laminates is placed on the lower group of components to slide over the surface of the horizontal structure upstream of the press.

At the end of the cycle the press opens, the metal supporting band carries the laminates and multi-layer laminates out of the press, simultaneously introducing inside it the new fraction of components prepared on the sliding surface of the horizontal structure, so that a fresh cycle of production can be started.

The Invention Offers Evident Advantages.

Production of laminates departs from reels of pre-preg and of metal strips which require no cutting.

The flattening sheets to separate packages are eliminated together with related problems arising during formation of packages of components, separating them, cleaning the flattening sheets and their removal after production.

Allowing a maximum time per cycle of 10' (using a continuous installation the cycle lasts 5'), a press with a pressing surface of about 5 $m^2$ produces 30 $m^2$/h of laminate. By means of suitable devices flow can be controlled and become perfectly linear with not more than 1-2 mm of excess material all round the edge of the product.

This permits the use of pre-preg with a high gel time, therefore highly liquid, ensuring greater uniformity of thickness and less tension on the laminates.

Waste due to trimming the laminates is considerably reduced.

By applying pressure and heat direct to each plastic laminate, heating penetrates evenly giving maximum precision of thickness.

Labour is drastically reduced so that working and investment costs are much lower than is possible with present methods.

BRIEF DESCRIPTIONS OF THE DRAWINGS

Characteristics and purposes of the invention will become still clearer from the following examples of its execution illustrated by diagrammatically drawn figures.

FIG. 1 The installation at the end of a cycle and when begining a fresh one, side view.

Figure 2:
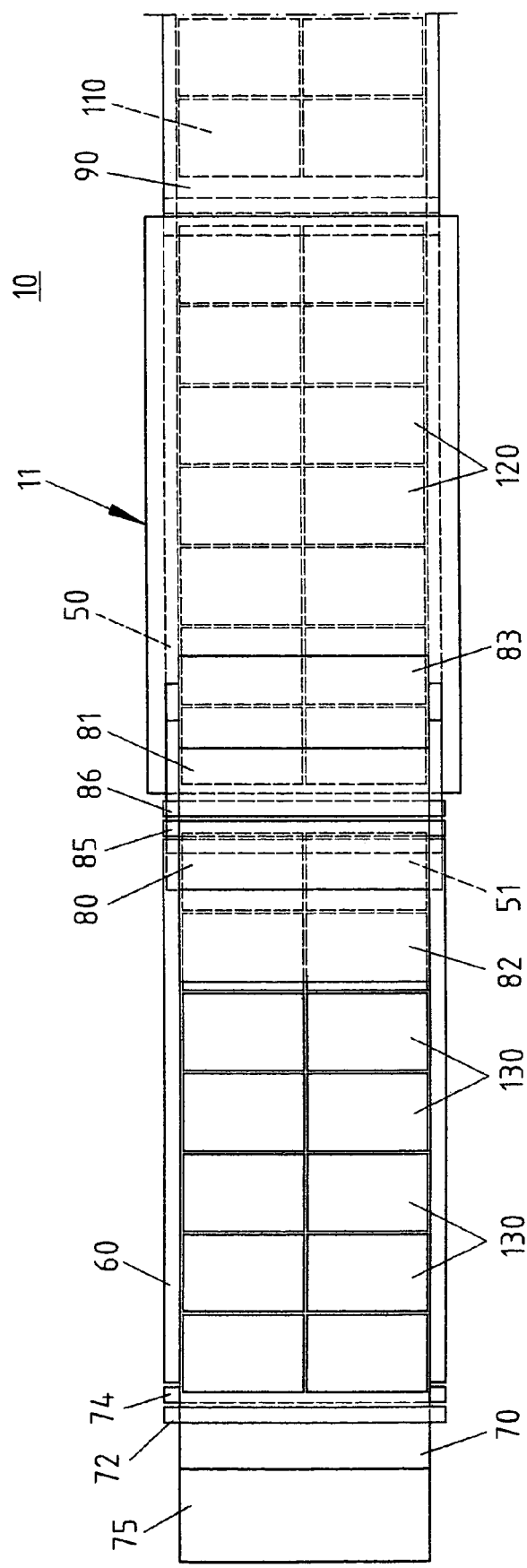

FIG. 2 The installation as in FIG. 1, seen from above.

DETAILED DESCRIPTION OF THE PREFERRED EMBODIMENTS

The installation 10 comprises the press 11 with fixed plate 12, and mobile plate 13. Electrodes 30 and 31 at the two longitudinal ends of the fixed plate 12 are connected by wires 32 and 33 to the generator 40 of electric current.

Inside the press, on the upper surface 15 of the plate 12, the aluminium band 20 moves, in the direction shown by the arrows, drawn by a motor, not shown for simplicity, passing between cylindrical transmissions 21 and 22, unwinding from the reel 25 and winding onto the reel 26, remaining in contact with the top of the electrodes 30 and 31. The copper strip 50 fed in from the reel 51, lies on said aluminium band passing through the cylindrical transmission 52.

Upstream of the press, at substantially the level of said copper strip 50 inside the press, is a structure having a sliding surface 60 to carry a pair of pre-preg bands 70 and 71 that unwind from reels 75 and 76, guided by cylindrical transmissions 72 and 73 at the position of said reels, and by the transmission 74 at the position of said sliding surface 60.

On reaching the end of one of the pre-preg bands from reels 75 or 76, the starting end of a new reel will be welded by device 76 to the unfinished one so that it can be drawn out. A second pair of pre-preg bands 80 and 81, substantially flush with the lower surface of the mobile plate 13 of the press 11, unwind from reels 82, 83 guided by cylindrical transmissions 85, 86 at the position of said reels, and by cylindrical transmission 87 at the lower surface of the mobile plate 13.

A strip of copper 90 is associated to said pair of pre-preg bands 80, 81, said strip unwinding from the reel 91 guided by cylilndrical transmissions 95 and 87.

Adherence among said bands 80, 81 and strip 90 is assured by a second heating device 100 substantially the same as the device 78 described above.

As already explained the drawings show the installation with the press open at the end of a cycle and at the start of a fresh one.

In the completed cycle the stage corresponding to pressure with heat and therefore to closure of the press, has caused stoppage of the band 20 and of all the bands of pre-preg 70, 71, 80, 81 and of the copper strips 50, 90.

During this stage the multi-layers 130 have been laid in two rows on the fraction of the pair of pre-preg bands 70 and 71 lying on the surface of the structure 60.

The beginning of a new cycle causes the band 20 to resume movement together with all the other bands and strips, and therefore exit from the press of the mullti-layer laminates 120 pressed following others like 110 already pressed in a preceding cycle, and causes the bands of pre-preg 70, 71 to draw inside the press the multilayer laminates 130 laid on them during the preceding cycle.

Said multi-layers 130 then lie between the pair of bands of pre-preg 70,71 associated to the copper strip 50, and the pair of bands of pre-preg 80,81 associated to the copper strip 90.

This causes the press to close and, by means of the electrodes 30, 31, also closure of the electric circuit of the generator 40 enabling a new heat and pressure cycle to start and new multi-layers to be laid on the bands of pre-preg 70 and 71 on the surface of the structure 60 upstream of the press.

At the close of the cycle the press opens and the installation once more appears as shown in the drawings.

The invention claimed is:

1. An installation for production of plastic laminates including multi-layer laminates, comprising:
    a cold press with a fixed lower plate and an upper mobile plate;
    a metal band placed on an upper surface of the lower plate to support and draw inside the press the components of the plastic laminates consisting of bands of pre-preg and strips of copper, said metal band being unwound by electric motor-driven means from a reel placed at entry to the press and rewound onto a reel placed at an exit from the press;
    a pair of electrodes situated respectively at an entrance to and at the exit from the press, wherein said pair of electrodes are connected to the electric circuit of a generator of electric current of adequate power, said band maintaining continuous contact with said pair of electrodes,
    wherein when said components of the plastic laminates have been drawn inside the press, thereby causing closure of both the press and the electric circuit, a fraction of said metal band between the two electrodes acts as an electric resistance generating heat required for pressing.

2. The installation as defined in claim 1, wherein the metal band is made of aluminum.

3. The installation as defined in claim 1, wherein the bands of pre-preg and strips of copper are fed in from reels, wherein an onward movement of said reels is aided by electric motor-driven means.

4. The installation as defined in claim 1, wherein the components of the plastic laminates comprise a lower group of components, wherein said lower group of components is positioned to slide on a surface of a horizontal structure situation upstream of the press substantially at a level of the metal band for supporting and drawing along of the components, placed inside the press.

5. The installation as defined in claim 4, wherein one or more rows of a number of multi-layer laminates are placed on a portion of the lower group present on the surface of the horizontal structure.

6. The installation as defined in claim 5, further comprising an electronic programming and control processor, wherein said electronic programming and control processor is provided for coordinating opening and closing of the press, for translation inside said press of the metal band, and for regulating the motor-driven means.

7. The installation as defined in claim 4, wherein a new set of multi-layers is placed on the lower group of components on the sliding surface of the horizontal structure upstream of the press after introduction inside the press of the components of the plastic laminates comprising multi-layer laminates and after closure of the press to start a cycle, wherein on completion of the cycle when said press opens, the metal band extracts the laminates and produced multi-layer laminates from the exit of the press and simultaneously introduces at the entrance to the press a new portion of components and multi-layer components placed on the lower group of said components to begin a new cycle.

* * * * *